US012740128B2

(12) United States Patent
Chou

(10) Patent No.: US 12,740,128 B2

(45) **Date of Patent: *Sep. 15, 2026**

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventor: Chun-Ting Chou, Kaohsiung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 57 days.

This patent is subject to a terminal disclaimer.

(21) Appl. No.: 18/734,345

(22) Filed: Jun. 5, 2024

(65) Prior Publication Data

US 2024/0321984 A1 Sep. 26, 2024

Related U.S. Application Data

(63) Continuation of application No. 17/370,621, filed on Jul. 8, 2021, now Pat. No. 12,034,054.

(60) Provisional application No. 63/166,056, filed on Mar. 25, 2021.

(51) Int. Cl.

*H10D 64/23* (2025.01)

*H10D 64/01* (2025.01)

(52) U.S. Cl.

CPC ......... *H10D 64/258* (2025.01); *H10D 64/015* (2025.01); *H10D 64/017* (2025.01); *H10D 64/021* (2025.01)

(58) Field of Classification Search

CPC ... H10D 64/015; H10D 64/021; H10D 64/017

See application file for complete search history.

(56) References Cited

U.S. PATENT DOCUMENTS

| | | | |
|---|---|---|---|
| 5,403,761 | A | 4/1995 | Rha |
| 8,669,170 | B2 | 3/2014 | Mikalo et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |

(Continued)

*Primary Examiner* — Chad M Dicke

*Assistant Examiner* — Valerie N Newton

(74) *Attorney, Agent, or Firm* — Birch, Stewart, Kolasch & Birch, LLP

(57) ABSTRACT

A method includes forming a gate dielectric layer and a dummy gate layer; forming a mask over the dummy gate layer; patterning the gate dielectric layer and the dummy gate layer to form a dummy gate structure, the dummy gate structure including a remaining portion of the gate dielectric layer and a remaining portion of the dummy gate layer; epitaxially growing a first spacer layer on the dummy gate structure and the substrate, in which the first spacer layer has a higher growth rate on the exposed surfaces of the dummy gate structure and the substrate than on exposed surfaces of the mask; doping the first spacer layer to form a doped spacer layer having a different lattice constant than the substrate; depositing a second spacer layer over the doped spacer layer; and etching the second spacer layer and the doped spacer layer to form a gate spacer.

20 Claims, 23 Drawing Sheets

(56) References Cited

U.S. PATENT DOCUMENTS

| | | | | |
|---|---|---|---|---|
| 9,520,482 | B1 | 12/2016 | Chang et al. | |
| 9,576,814 | B2 | 2/2017 | Wu et al. | |
| 9,608,116 | B2 | 3/2017 | Ching et al. | |
| 9,812,363 | B1 | 11/2017 | Liao et al. | |
| 9,859,380 | B2 | 1/2018 | Lee et al. | |
| 12,034,054 | B2 * | 7/2024 | Chou | H10D 64/021 |
| 2004/0063264 | A1 | 4/2004 | Zheng et al. | |
| 2004/0259336 | A1 | 12/2004 | Yeh et al. | |
| 2009/0085122 | A1 | 4/2009 | Ho et al. | |
| 2012/0003825 | A1 | 1/2012 | Dip | |
| 2012/0012904 | A1 | 1/2012 | Wei et al. | |
| 2012/0181634 | A1 | 7/2012 | Yin et al. | |
| 2013/0001565 | A1 | 1/2013 | Jung et al. | |
| 2016/0086796 | A1 | 3/2016 | Chan et al. | |
| 2017/0317079 | A1 * | 11/2017 | Kim | H10D 64/017 |
| 2018/0040620 | A1 | 2/2018 | Ha et al. | |
| 2019/0148501 | A1 | 5/2019 | Chen et al. | |
| 2020/0027719 | A1 * | 1/2020 | Liao | H01L 21/02211 |

* cited by examiner

Fig. 6B

SEMICONDUCTOR DEVICE AND METHOD FOR FORMING THE SAME

PRIORITY CLAIM AND CROSS-REFERENCE

The present application is a continuation application of U.S. patent application Ser. No. 17/370,621, filed on Jul. 8, 2021, which claims priority to U.S. Provisional Application Ser. No. 63/166,056, filed Mar. 25, 2021, which are herein incorporated by references in their entireties.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices are a type of multi-gate structure that include semiconductor fins with high aspect ratios and in which channel and source/drain regions of semiconductor transistor devices are formed. A gate is formed over and along the sides of the fin structure (e.g., wrapping) utilizing the increased surface area of the channel and source/drain regions to produce fast, reliable and well-controlled semiconductor transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
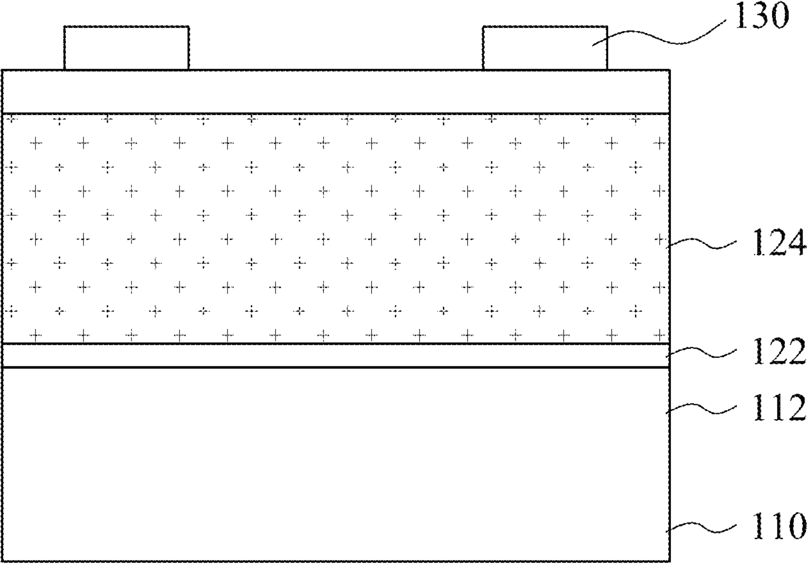
FIGS. 1 to 13 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of structures that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Reference is made to FIG. 1. Shown there is a substrate 110. In some embodiments, the substrate 110 may include a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

In some embodiments, the substrate 110 may include a semiconductor fin 112 protrudes from the substrate 110. The semiconductor fin 112 may be formed by, for example, forming a patterned mask layer, which defines the position of the semiconductor fin 112, over the substrate 110, and performing one or more etching processes to partially remove the substrate 110 to form at least one fin-like structure protruded from the top surface of the substrate 110. In some embodiments, a plurality of isolation dielectric structure (not shown) as shallow trench isolation (STI) may be formed adjacent to the semiconductor fin 112.

A gate dielectric layer 122 is formed over the semiconductor fin 112, and then a dummy gate layer 124 is formed over the gate dielectric layer 122. In some embodiments, the gate dielectric layer 122 may be, for example, silicon oxide, silicon nitride, a combination thereof, or the like, and may be deposited or thermally grown according to acceptable techniques. The gate dielectric layer 122 may be formed by suitable process, such as chemical vapor deposition (CVD), physical vapor deposition (PVD), atomic layer deposition (ALD), or any suitable process. The dummy gate layer 124 may include amorphous silicon (a-Si). The dummy gate layer 124 may be formed by suitable process, such as chemical vapor deposition (CVD), physical vapor deposition (PVD), atomic layer deposition (ALD), or any suitable process.

Patterned masks 130 are formed over the dummy gate layer 124. The patterned masks 130 define the positions where the dummy gate structures (e.g., dummy gate structures 120 in FIG. 2) located. In some embodiments, the masks 130 may include silicon oxide, silicon nitride, silicon oxynitride, and/or other suitable materials. In some embodiments, each of the masks 130 may include a pad oxide and a mask layer over the pad oxide. In some embodiments, the pad oxide may be formed by thermally oxidizing a top region of the dummy gate layer 124 or by a deposition process such as CVD, PVD, ALD, or other suitable processes. The pad oxide may include silicon oxide ($SiO_2$). The mask layer may be formed of silicon nitride, such as $Si_3N_4$, and may be formed by suitable process, such as CVD, PVD, ALD, or other suitable processes. In some embodiments, the masks 130 can also be referred to as hard masks.

Figure 2:
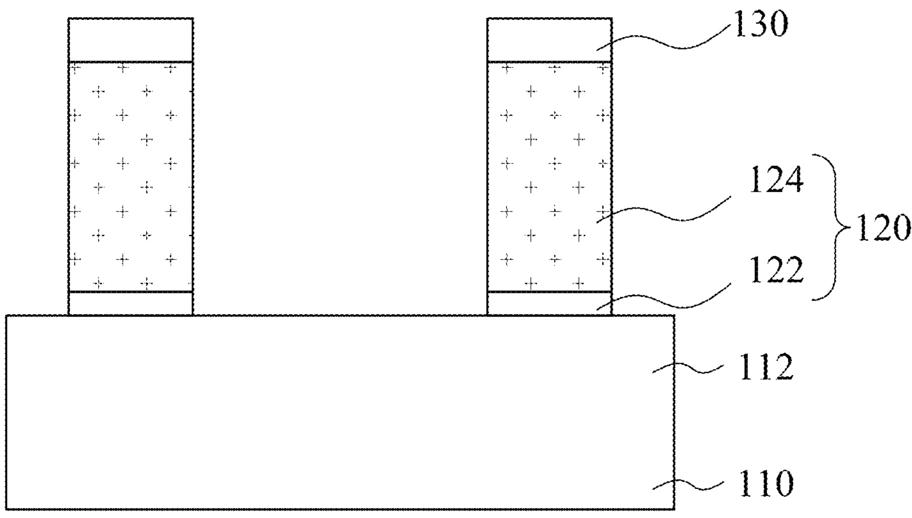

Reference is made to FIG. 2. The gate dielectric layer 122 and the dummy gate layer 124 are patterned using the masks 130 to form dummy gate structures 120. In some embodiments, the portions of the gate dielectric layer 122 and the dummy gate layer 124 that are not covered by the masks 130 are removed using, for example, a dry etch, a wet etch, or combinations thereof. Accordingly, after the patterning process, each of the dummy gate structures 120 includes remaining portions of the gate dielectric layer 122 and the dummy gate layer 124 with a respective mask 130 atop.

Figure 3:
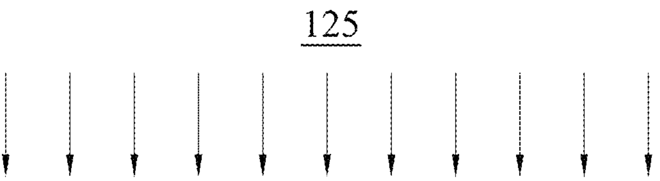
Figure 3:
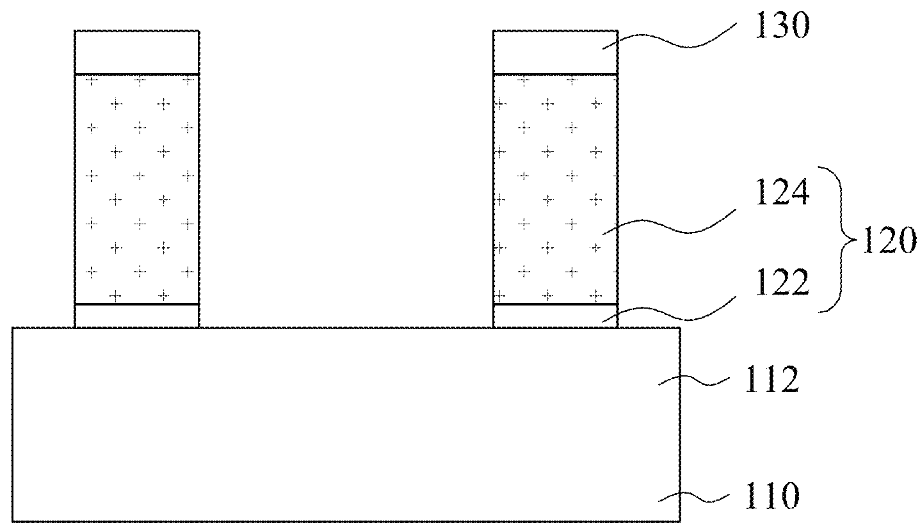

Reference is made to FIG. 3. After the dummy gate structures 120 are formed (e.g., after the gate dielectric layer 122 and the dummy gate layer 124 are patterned), a crystallization process 125 is performed to crystallize the amorphous material of the dummy gate structures 120. In some embodiments where the dummy gate layer 124 of the dummy gate structures 120 is made of amorphous silicon, the crystallization process 125 is performed to crystallize the amorphous silicon (a-silicon) to create poly-crystalline silicon (poly-silicon). In some embodiments, the crystallization process 125 may be performed by an annealing with temperature in a range from about 500° C. to about 800° C. for about 100 s to about 5-10 hrs.

Figure 4A:
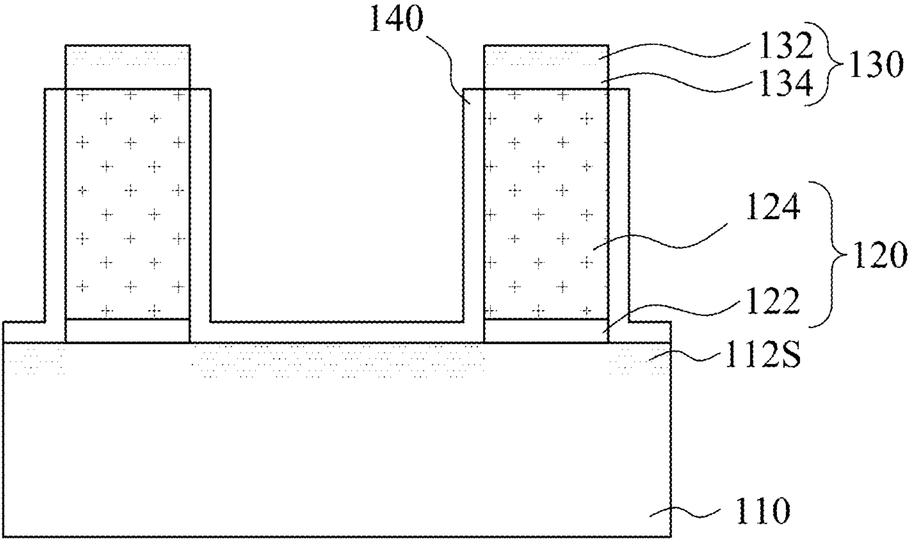
Figure 4B:
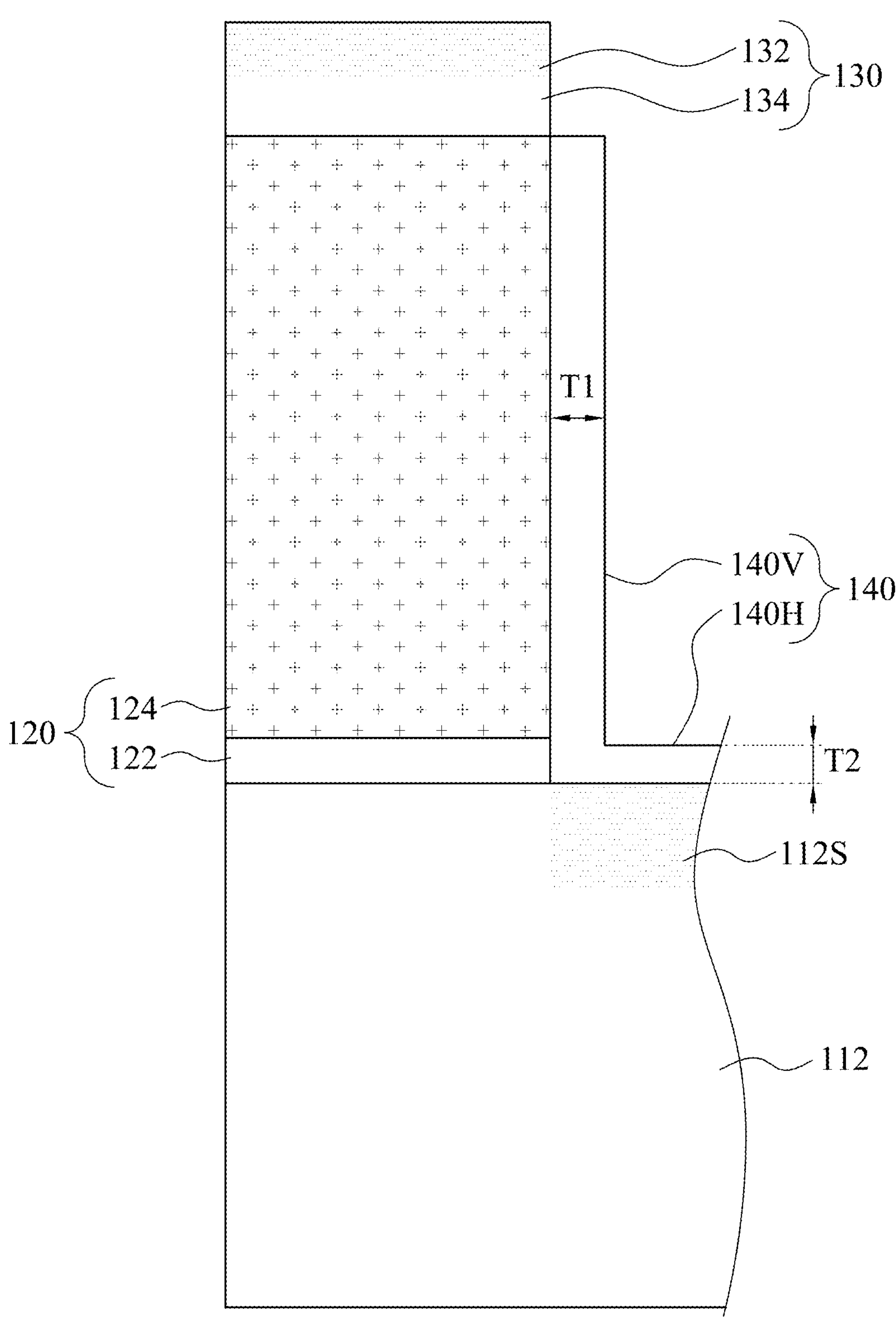

Reference is made to FIGS. 4A and 4B, in which FIG. 4B is an enlarged view of FIG. 4A. A first spacer layer 140 is formed over the substrate 110 and on opposite sidewalls of the dummy gate structures 120. In some embodiments, the first spacer layer 140 may include a semiconductor material such as silicon (Si), and/or other suitable materials, and may be formed by selective epitaxial growth (SEG) in suitable epitaxial deposition system, including, but not limited to, metal-organic chemical vapor deposition (MOCVD), atmospheric-pressure CVD (APCVD), low-(or reduced-) pressure CVD (LPCVD), ultra-high-vacuum CVD (UHVCVD), molecular beam epitaxy (MBE). In some embodiments, the epitaxy process may use gaseous and/or liquid precursors. For example, in the depicted embodiment, CVD epitaxial growth process uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; and a carrier gas including He, $N_2$, $H_2$, Ar, other suitable carrier gases, or combinations thereof. For example, forming a first spacer layer 140 of silicon may include using a DCS flow rate of about 5000 sccm to about 30000 sccm with a $H_2$ carrier gas, in a chamber pressure of about 10 Torr to about 30 Torr for about 100 s to about 500 s. The first spacer layer 140 may be grown at a temperature of about 600° C. to about 700° C. As the first spacer layer 140 is formed by epitaxial growth, the first spacer layer 140 may also be referred to as an epitaxial layer.

As a result, the first spacer layer 140 may be grown on the exposed surfaces of the semiconductor fin 112 and the exposed surfaces of the dummy gate structures 120. The first spacer layer 140 may have a higher growth rate on the exposed surfaces of the semiconductor fin 112 and the exposed surfaces of the dummy gate structures 120 than on the exposed surfaces of the masks 130. In some embodiments, the first spacer layer 140 is not formed on the exposed surfaces of the masks 130. Stated another way, the exposed surfaces of the masks 130 are free from coverage of the first spacer layer 140. In some embodiments, the topmost end of the first spacer layer 140 may be substantially level with the top surfaces of the dummy gate structures 120, and may be lower than the top surfaces of the masks 130. As shown in FIG. 4B, the first spacer layer 140 may include a vertical portion 140V extending along the sidewall of the dummy gate structure 120 and a horizontal portion 140H extending along the top surface of the semiconductor fin 112.

In some embodiments, the dummy gate layer 124 is made of poly-crystalline silicon (poly-silicon), and the semiconductor fin 112 is made of single-crystalline silicon, and the first spacer layer 140 has a higher growth rate on surface of the poly-crystalline silicon than on surface of the single-crystalline silicon. As a result, the vertical portion 140V of the first spacer layer 140 may be thicker than the horizontal portion 140H of first spacer layer 140. For example, the vertical portion 140V of the first spacer layer 140 may include a thickness T1, and the horizontal portion 140H of first spacer layer 140 may include a thickness T2, in which thickness T1 is greater than thickness T2.

During the epitaxial growth of the first spacer layer 140, an in-situ doping process may be performed to dope dopants into the first spacer layer 140. In some embodiments wherein the first spacer layer 140 is made of silicon, the dopants may be carbon (C), and thus the first spacer layer 140 is doped with carbon to form $Si:C_z$, where z is carbon concentration in atomic percentage. Accordingly, the first spacer layer 140 may be referred to as a carbon-doped silicon spacer layer, or a carbon-doped epitaxial layer. In some embodiments, the carbon concentration (atomic percentage) z is in a range of about 1.60% to about 1.70%, such as about 1.65%. In some embodiments where the first spacer layer 140 is a carbon-doped silicon spacer layer, the dielectric constant of the first spacer layer 140 may be in a range from about 6.5 to about 10.

In some embodiments, the carbon concentration in the silicon spacer layer 140 may be nonuniform. In some embodiments, the silicon spacer layer 140 may have a carbon concentration gradient. In some embodiments, the silicon spacer layer 140 may different lattice constant from the semiconductor fin 112. The lattice mismatch between silicon and carbon can induce strong tensile stress to the channel region below the dummy gate structure 120, which in turn will improve the carrier mobility (e.g., hole mobility in n-type transistor), and will further improve device performance. Accordingly, the first spacer layer 140 may be referred to as a stress spacer. If the carbon concentration (atomic percentage) z is too low (e.g., lower than about 1.60%), the first spacer layer 140 may provide insufficient stress to the channel region. If the carbon concentration (atomic percentage) z is too high (e.g., higher than about 1.70%), the crystalline quality of first spacer layer 140 may be unsatisfied. Here, the "channel region" is a region of the semiconductor fin 112 that is beneath the dummy gate structures 120. As a tensile stress may be beneficial to an N-type device, the structure described in FIGS. 1 to 13 may be an N-type FET.

As mentioned above, the first spacer layer 140 is made of silicon doped with carbon. In some embodiments, the carbon concentration (atomic percentage) may be low enough such that the first spacer layer 140 has semiconductor properties rather than dielectric properties. In that case, the first spacer layer 140 (i.e., carbon-doped silicon) with a fine-tuned carbon concentration, as discussed above, may have a smaller band gap than silicon carbide.

In some embodiments, as the first spacer layer 140 is doped during the epitaxial growth of the first spacer layer 140, the dopants may also be introduced into the surface regions of the masks 130 and the semiconductor fin 112. For example, an upper portion 132 of the mask 130 may include impurities that are the same as the dopants of the first spacer layer 140, such as carbon (C), while the lower portion 134 of the mask 130 may be free of the impurities (e.g., un-doped). Moreover, the surface region 112S of the semiconductor fin 112 may include impurities that are the same as the dopants of the first spacer layer 140, such as carbon (C).

In some embodiments, the crystallization process 125 discussed in FIG. 3 may be performed after the first spacer layer 140 is formed. That is, prior to forming the first spacer layer 140, the dummy gate structures 120 may be made of amorphous silicon. After the first spacer layer 140 is formed, the crystallization process is performed to crystallize the amorphous silicon (a-silicon) of dummy gate structures 120 into poly-crystalline silicon (poly-silicon).

Figure 5A:
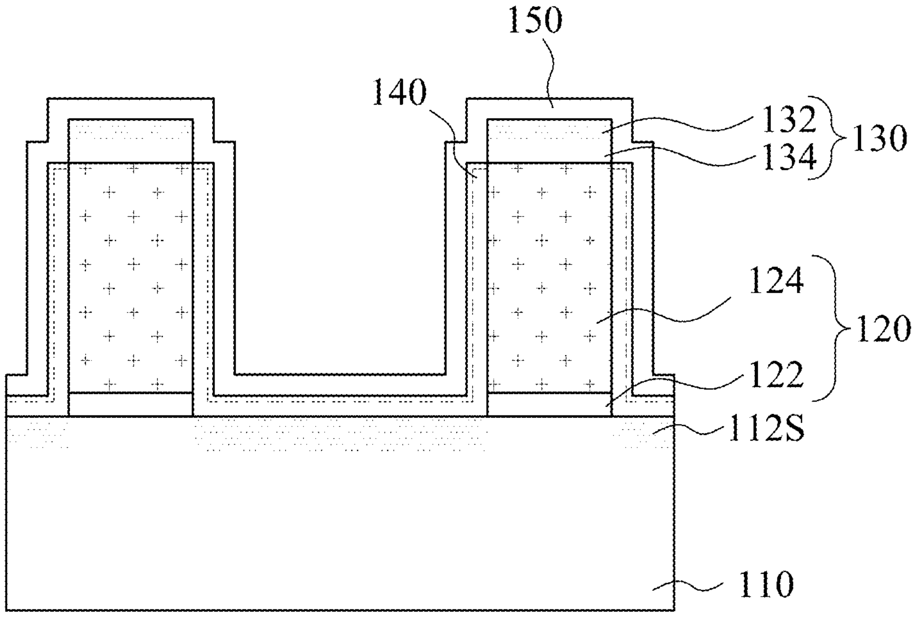
Figure 5B:
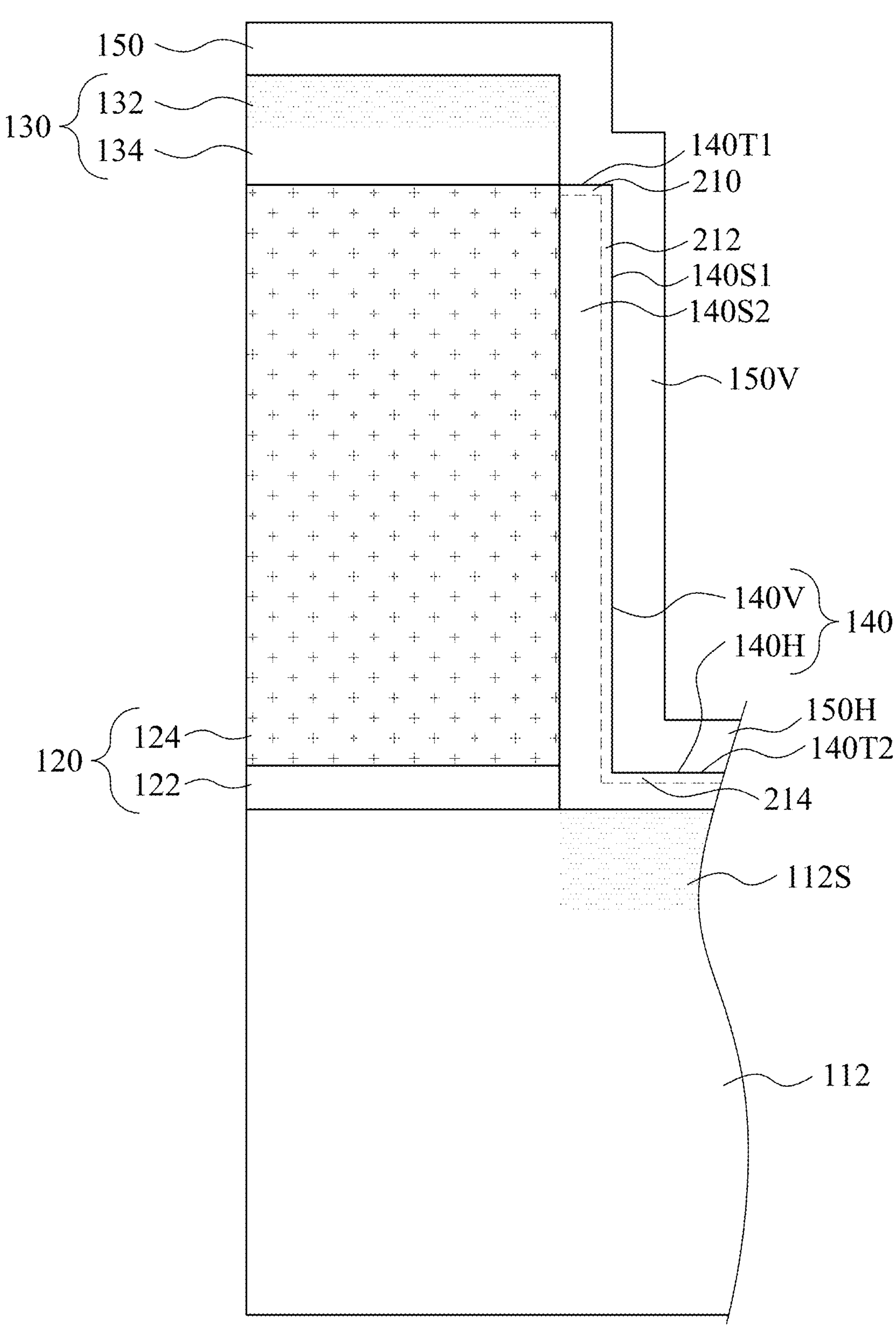

Reference is made to FIGS. 5A and 5B, in which FIG. 5B is an enlarged view of FIG. 5A. A second spacer layer 150 is formed over the substrate 110 and covering the first spacer layer 140. In some embodiments, the second spacer layer 150 is formed by a conformal deposition process, such as a CVD, flowable CVD, ALD, or other suitable process. Accordingly, the second spacer layer 150 may be formed blanket over the substrate 110. As a result, the second spacer layer 150 may cover exposed surfaces of the first spacer layer 140 and exposed surfaces of the masks 130. In greater details, the second spacer layer 150 may be in contact with opposite sidewalls and top surface of each mask 130. As mentioned above, the first spacer layer 140 is formed with a selective manner, while the second spacer layer 150 is formed with a conformal manner. Accordingly, the second spacer layer 150 is more conformal than the first spacer layer 140. In some embodiments, the second spacer layer 150 may have a stepped sidewall along the dummy gate structures 120 and the masks 130, while the first spacer layer 140 may have a substantially straight sidewall along the dummy gate structures 120 and the masks 130.

In some embodiments, because the second spacer layer 150 is deposited by conformal deposition process, the second spacer layer 150 may include more uniform thickness than the first spacer layer 140. For example, the second spacer 150 may include a vertical portion 150V along the vertical portion 140V of the first spacer layer 140, and a horizontal portion 150H along the horizontal portion 140H of the first spacer layer 140. In some embodiments, vertical portion 150V and the horizontal portion 150H may include substantially the same thickness. In some embodiments, because the first spacer layer 140 has a growth rate difference between its growth on single-crystalline silicon and its growth on polycrystalline silicon, the thickness difference between the vertical portion 140V and the horizontal portion 140H of the first spacer layer 140 is greater than the thickness difference between the vertical portion 150V and the horizontal portion 150H of the second spacer layer 150.

In some embodiments, the second spacer layer 150 may include dielectric material, such as $SiO_2$, $Si_3N_4$, $SiO_xN_y$, SiCN films, SiOC, SiOCN films, and/or combinations thereof. In some embodiments, different from the first spacer layer 140, the second spacer layer 150 has dielectric properties rather than semiconductor properties.

Reference is made to FIG. 5B. In some embodiments, the surface regions of the first spacer layer 140 (i.e., carbon-doped silicon spacer layer) may be oxidized. This is because the first spacer layer 140 and the second spacer layer 150 may be formed ex-situ in different chambers. That is, after the first spacer layer 140 is formed, the structure shown in FIGS. 4A and 4B may be transferred from a first chamber where the first spacer layer 140 is formed to a second chamber where the second spacer layer 150 is formed. Accordingly, the surfaces of semiconductor materials (i.e., carbon-doped silicon) of the first spacer layer 140 may be exposed to the air, and thus the surface regions of the first spacer layer 140 may be oxidized to have native oxide.

In greater details, with respect to the vertical portion 140V of the first spacer layer 140, the vertical portion 140V of the first spacer layer 140 may be oxidized from the top surface 140T1 of the vertical portion 140V and the outer sidewall 140S1 of the vertical portion 140V. Accordingly, a region 210 of the vertical portion 140V of the first spacer layer 140 that is close to the top surface 140T1 of the vertical portion 140V of the first spacer layer 140 may be oxidized, and a region 212 of the vertical portion 140V of the first spacer layer 140 that is close to the outer sidewall 140S1 of the first spacer layer 140 may be oxidized. On the other hand, a region of the vertical portion 140V of the first spacer layer 140 that is close to the dummy gate structure 120 may not be oxidized, because the inner sidewall 140S2 of the vertical portion 140V of the first spacer layer 140 is still covered by the dummy gate structure 120.

With respect to the horizontal portion 140H of the first spacer layer 140, the horizontal portion 140H of the first spacer layer 140 may be oxidized from the top surface 140T2 of the horizontal portion 140H. Accordingly, a region 214 of the horizontal portion 140H of the first spacer layer 140 that is close to the top surface 140T2 of the horizontal portion 140H of the first spacer layer 140 may be oxidized. On the other hand, region of the horizontal portion 140H of the first spacer layer 140 that is close to the semiconductor fin 112 may not be oxidized, because the bottom surface of the horizontal portion 140H of the first spacer layer 140 is still covered by the semiconductor fin 112.

In some embodiments where the first spacer layer 140 is made of carbon doped silicon, the regions 210, 212, 214 of the first spacer layer 140 made be oxidized to form a carbon doped silicon oxide layer. In some embodiments, the oxidation of the first spacer layer 140 may reduce the dielectric constant of the first spacer layer 140. For example, if the regions 210, 212, 214 of the first spacer layer 140 includes carbon doped silicon oxide layer, a dielectric constant of the regions 210, 212, 214 of the first spacer layer 140 may be in a range from about 2.7 to about 3.2. On the other hand, regions of the first spacer layer 140 may include carbon doped silicon, which may include a dielectric constant in a range from about 6.5 to about 10. As mentioned above in FIGS. 4A and 4B, the first spacer layer 140 is a semiconductor layer, accordingly, the regions 210, 212, 214 of the first spacer layer 140 may be transferred from semiconductor regions to dielectric regions.

Furthermore, the oxygen concentration (atomic percent) of the regions 210, 212, 214 of the first spacer layer 140 may be higher than the regions of the first spacer layer 140 that are not oxidized. In some embodiments, because the first spacer layer 140 may be oxidized when exposed to the air, the first spacer layer 140 can act as an oxygen buffer layer to retard oxygen diffusion.

Furthermore, the dielectric constant of the regions 210, 212, 214 of the first spacer layer 140 may also be reduced to form low-k dielectric regions. That is, the regions 210, 212, 214 of the first spacer layer 140 may include a dielectric constant lower than the dielectric constant of the regions of the first spacer layer 140 that are not oxidized.

Figure 6A:
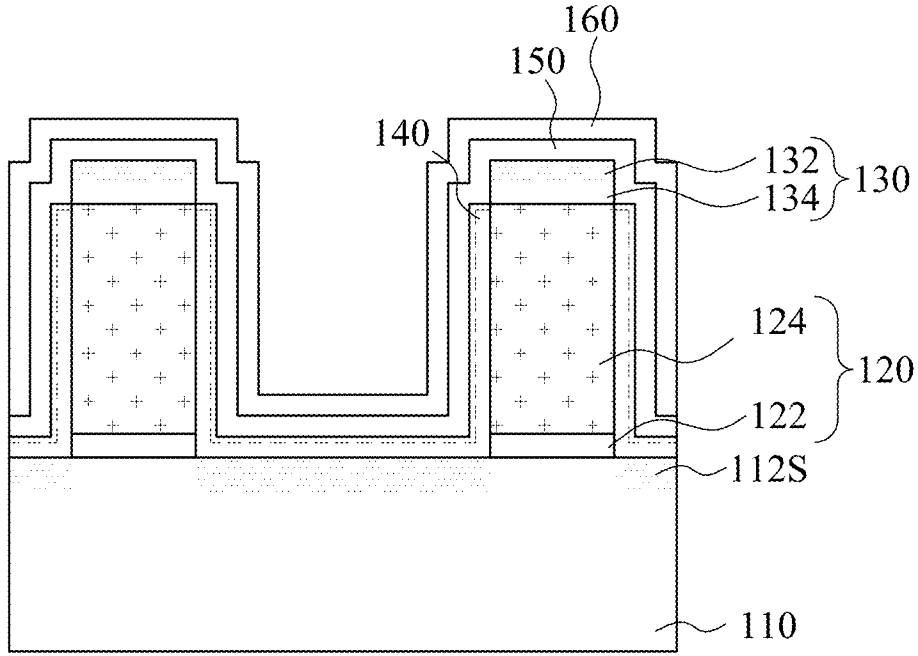
Figure 6B:
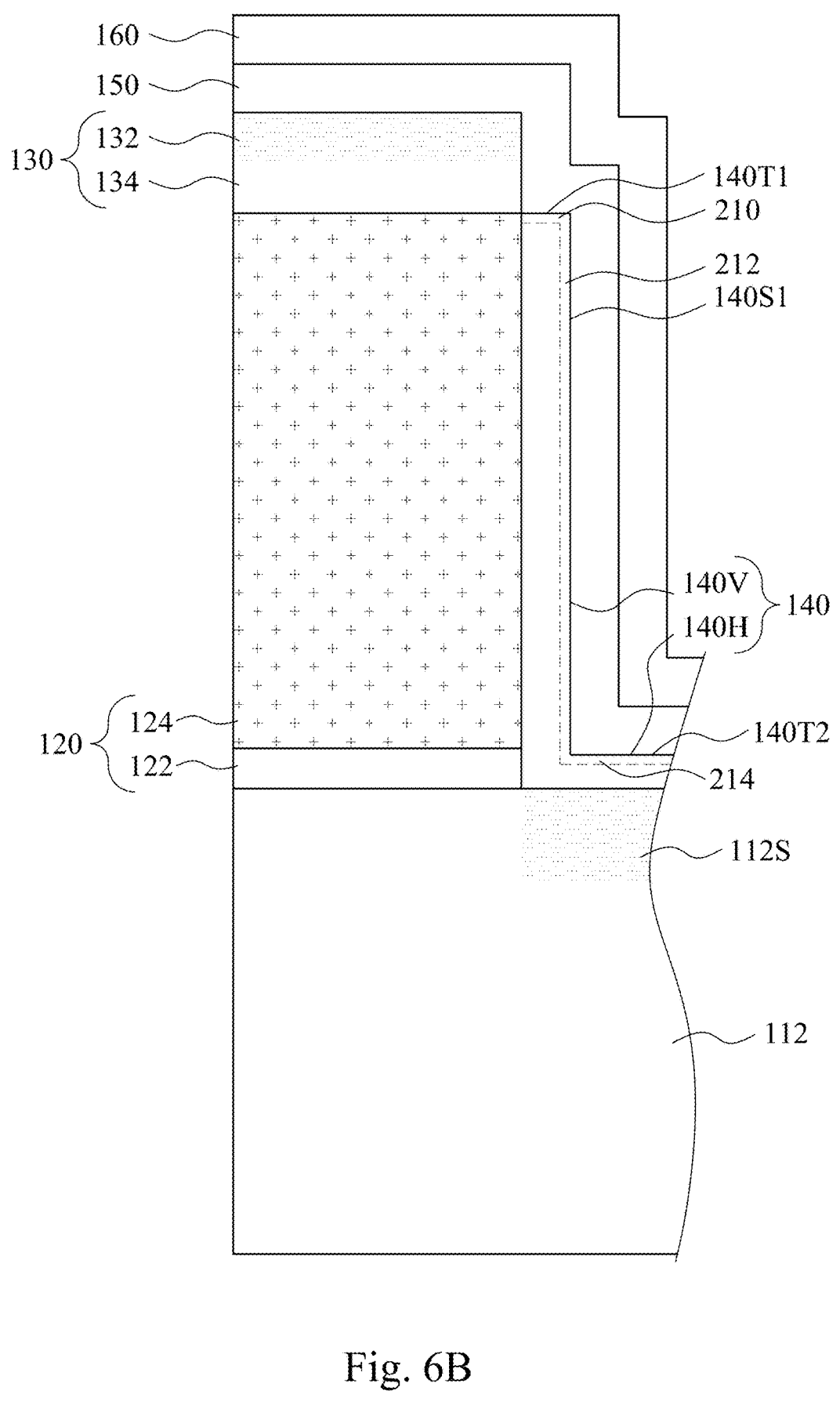

Reference is made to FIGS. 6A and 6B, in which FIG. 6B is an enlarged view of FIG. 6A. A third spacer layer 160 is formed over the substrate 110 and covering the second spacer layer 150. In some embodiments, the third spacer layer 160 is formed by a conformal deposition process, such as a CVD, flowable CVD, ALD, or other suitable process. Accordingly, the third spacer layer 160 may be formed blanket over the substrate 110. In some embodiments, the third spacer layer 160 may include portions that are vertically above the dummy gate structures 120 and the masks 130. In some embodiments, the third spacer layer 160 may have a stepped sidewall along the dummy gate structures 120 and the masks 130.

In some embodiments, the third spacer layer 160 may include dielectric material, such as $SiO_2$, $Si_3N_4$, $SiO_xN_y$, SiCN films, SiOC, SiOCN films, and/or combinations thereof. In some embodiments, different from the first spacer layer 140, the third spacer layer 160 has dielectric properties rather than semiconductor properties. In some embodiments wherein the second and third spacer layers 150 and 160 are made of SiOCN, the third spacer layer 160 may include more oxygen concentration (atomic percent) than the second spacer layer 150. In some embodiments, the third spacer layer 160 may include lower dielectric constant than the second spacer layer 150. For example, the second spacer layer 150 may include a dielectric constant in a range from about 4.9 to about 5, while the third spacer layer 160 may include a dielectric constant in a range from about 4.1 to about 4.2.

Figure 7A:
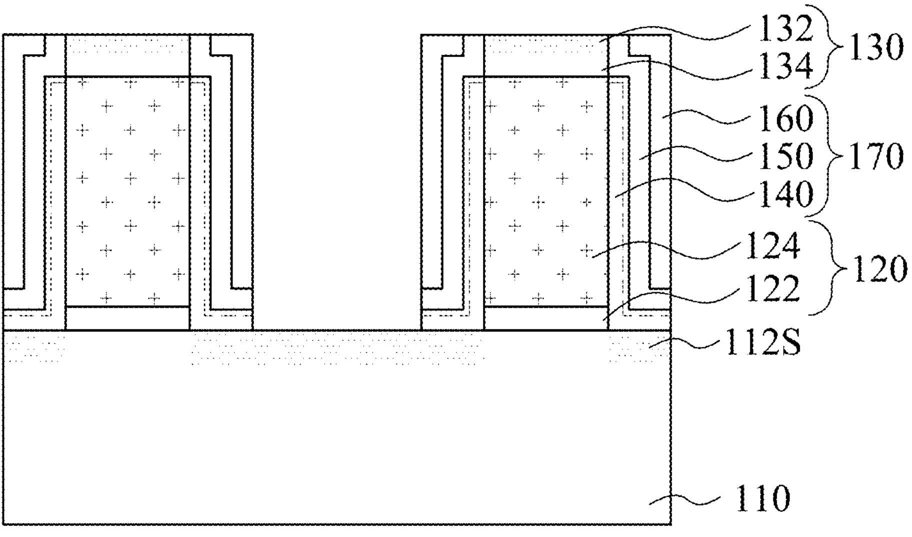
Figure 7B:
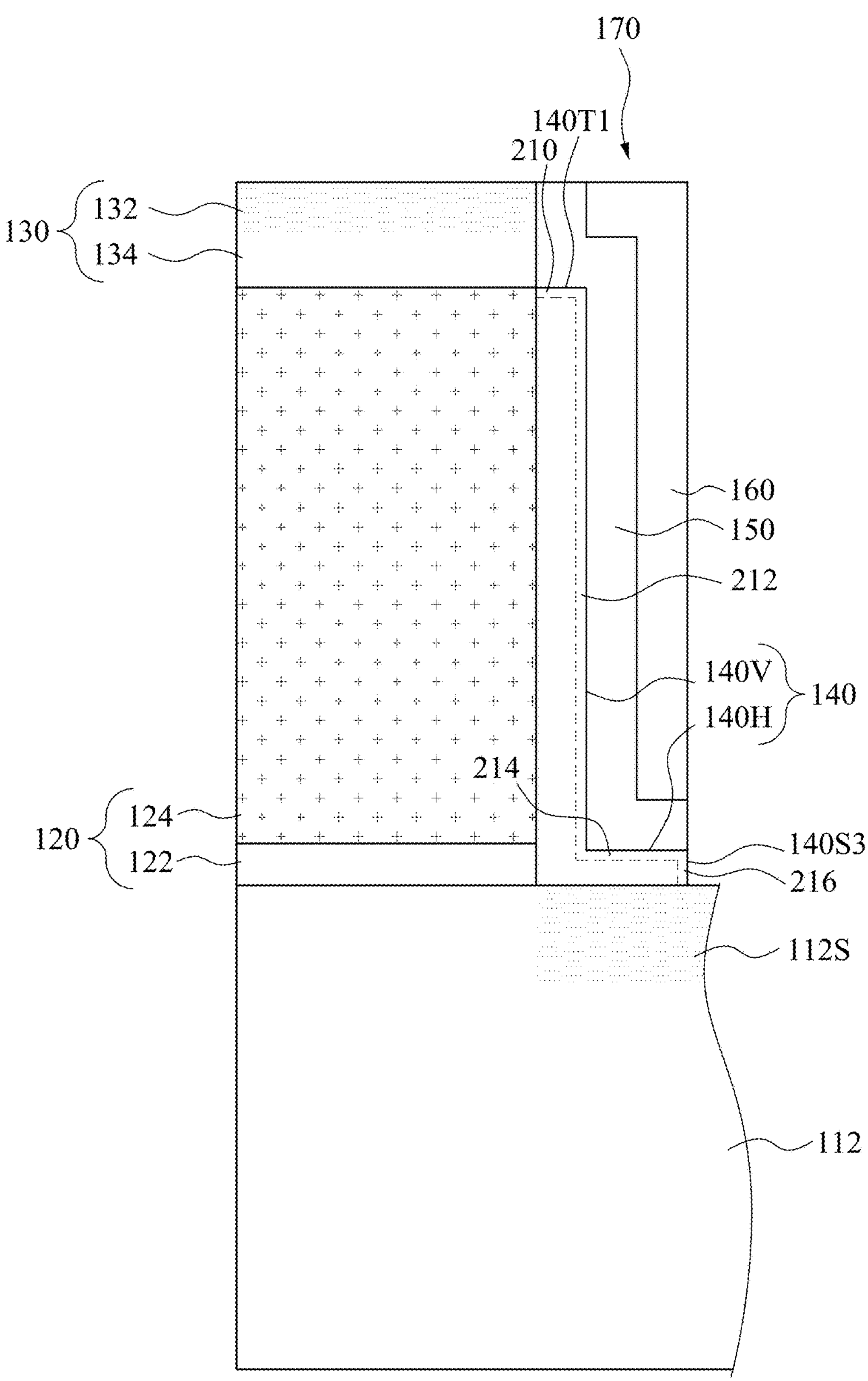

Reference is made to FIGS. 7A and 7B, in which FIG. 7B is an enlarged view of FIG. 7A. The first spacer layer 140, the second spacer layer 150, and the third spacer layer 160 are patterned to form gate spacers 170 on opposite sidewalls of each of the dummy gate structures 120. In some embodiments, the first spacer layer 140, the second spacer layer 150, and the third spacer layer 160 may be patterned by performing an anisotropic etching to remove the horizontal portions of the first spacer layer 140, the second spacer layer 150, and the third spacer layer 160, while leaving the vertical portions of the first spacer layer 140, the second spacer layer 150, and the third spacer layer 160 on sidewalls of the dummy gate structures 120. In some embodiments, each of the gate spacers 170 includes remaining portions of the first spacer layer 140, the second spacer layer 150, and the third spacer layer 160.

In FIG. 7B, after the gate spacers 170 are formed, the sidewall 140S3 of the horizontal portion 140H of the first spacer layer 140 may be exposed. In some embodiments, the gate spacers 170 may be exposed to the air after the formation. Accordingly, a region 216 of the horizontal portion 140H of the first spacer layer 140 that is close to the sidewall 140S3 of the horizontal portion 140H of the first spacer layer 140 may be oxidized.

In some embodiments where the first spacer layer 140 is made of carbon doped silicon, the region 216 of the first spacer layer 140 made be oxidized to form a carbon doped silicon oxide layer. As mentioned above in FIGS. 4A and 4B, the first spacer layer 140 is a semiconductor layer, according, the region 216 of the first spacer layer 140 may be transferred from a semiconductor region to a dielectric region. Furthermore, the oxygen concentration (atomic percent) of the region 216 of the first spacer layer 140 may be higher than the regions of the first spacer layer 140 that are not oxidized. In some embodiments, because the first spacer layer 140 may be oxidized when exposed to the air, the first spacer layer 140 can act as an oxygen buffer layer to retard oxygen penetration.

Furthermore, the dielectric constant of the region 216 of the first spacer layer 140 may also be decreased to form low-k dielectric regions. That is, the region 216 of the first spacer layer 140 may include a dielectric constant lower than the dielectric constant of the regions of the first spacer layer 140 that are not oxidized.

Figure 8A:
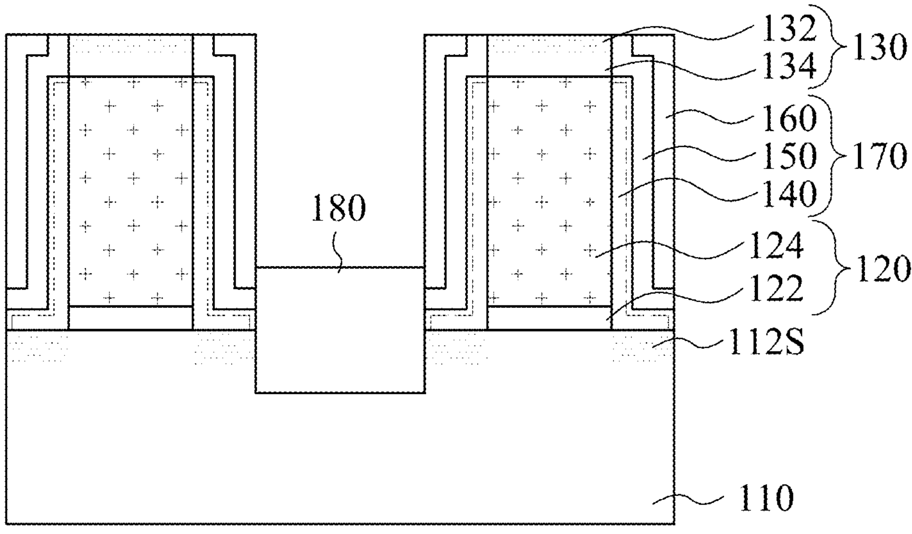
Figure 8B:
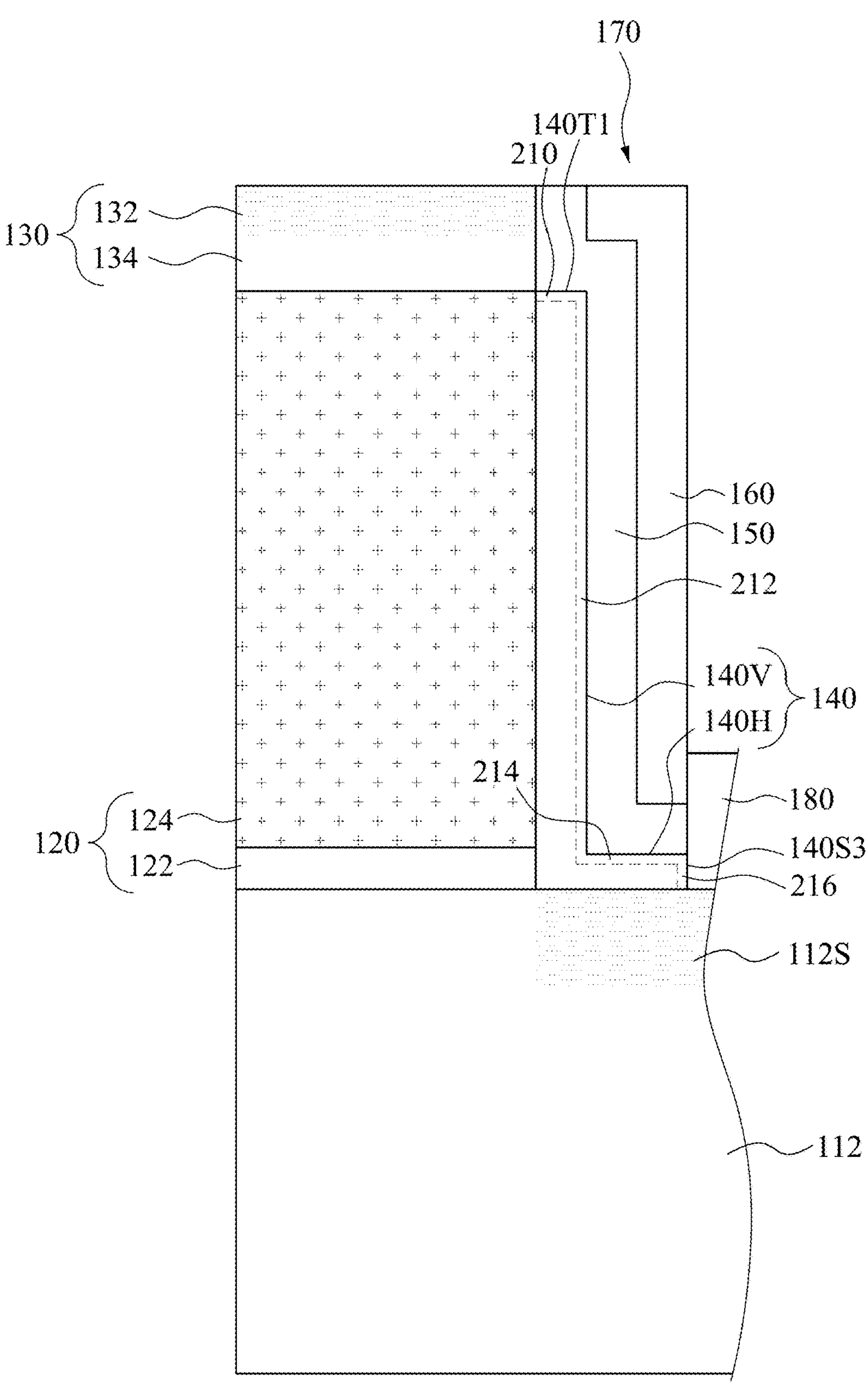

Reference is made to FIGS. 8A and 8B, in which FIG. 8B is an enlarged view of FIG. 8A. A source/drain epitaxial structure 180 is formed in the semiconductor fin 112. In some embodiments, source/drain epitaxial structures 180 may be formed on opposite sides of the each of the dummy gate structure 120. As mentioned above, as the device may be an N-type device, the source/drain epitaxial structure 180 may include n-type dopants such as phosphorus for formation of n-type FETs. In some embodiments, the source/drain epitaxial structure 180 may include Ge, Si, GaAs, AlGaAs, SiGe, GaAsP, SiP, or other suitable material. In some embodiments, the source/drain epitaxial structure 180 may be formed by, for example, etching portions of the semiconductor fin 112 exposed by the dummy gate structures 120 and the gate spacers 170 to form a recess, and then growing an epitaxial layer on the exposed surfaces of the semiconductor fin 112.

Figure 9:
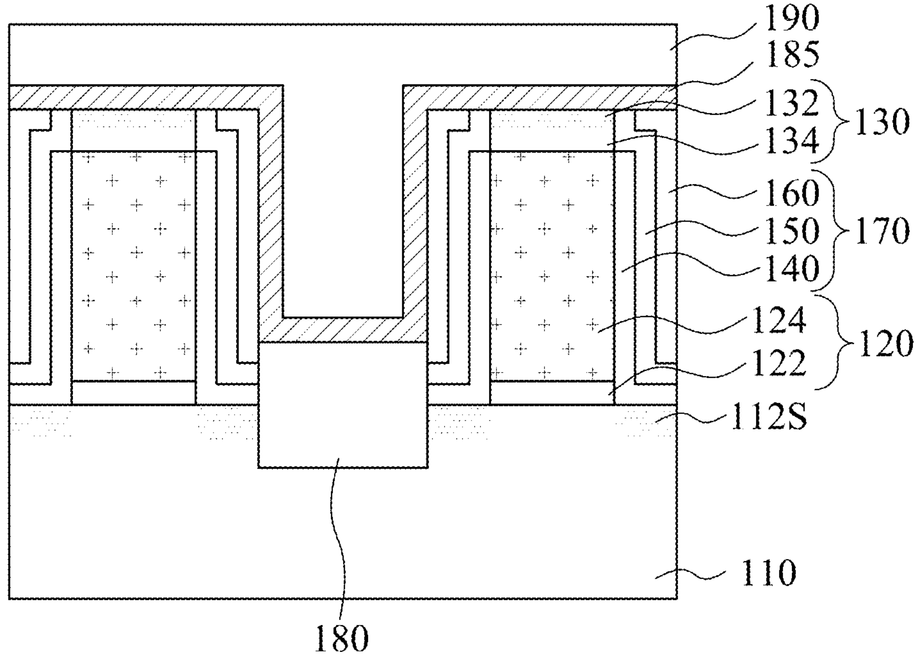

Reference is made to FIG. 9. A contact etch stop layer (CESL) 185 and an interlayer dielectric (ILD) layer 190 are formed over the substrate 110. In some embodiments, the CESL 185 may include material different from the ILD layer 190, thus resulting in different etch selectivity between CESL 185 and the ILD layer 190. In some embodiments, the CESL 185 includes silicon nitride, silicon oxynitride or other suitable materials. In some embodiments, the ILD layer 190 may include silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the CESL 185 and the ILD layer 190 may be formed by suitable deposition process, such as CVD, PVD, ALD, or the like.

Figure 10A:
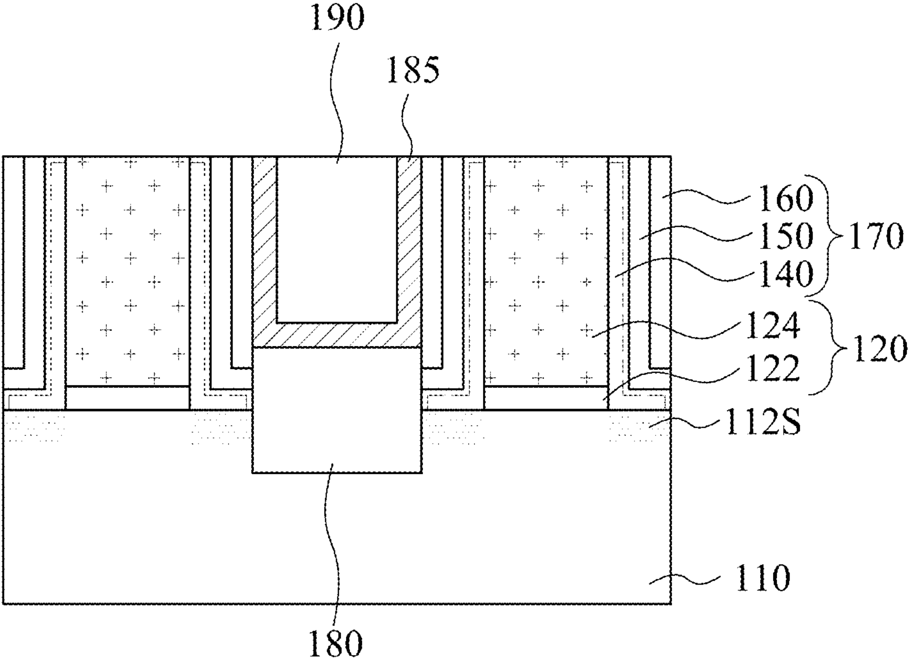
Figure 10B:
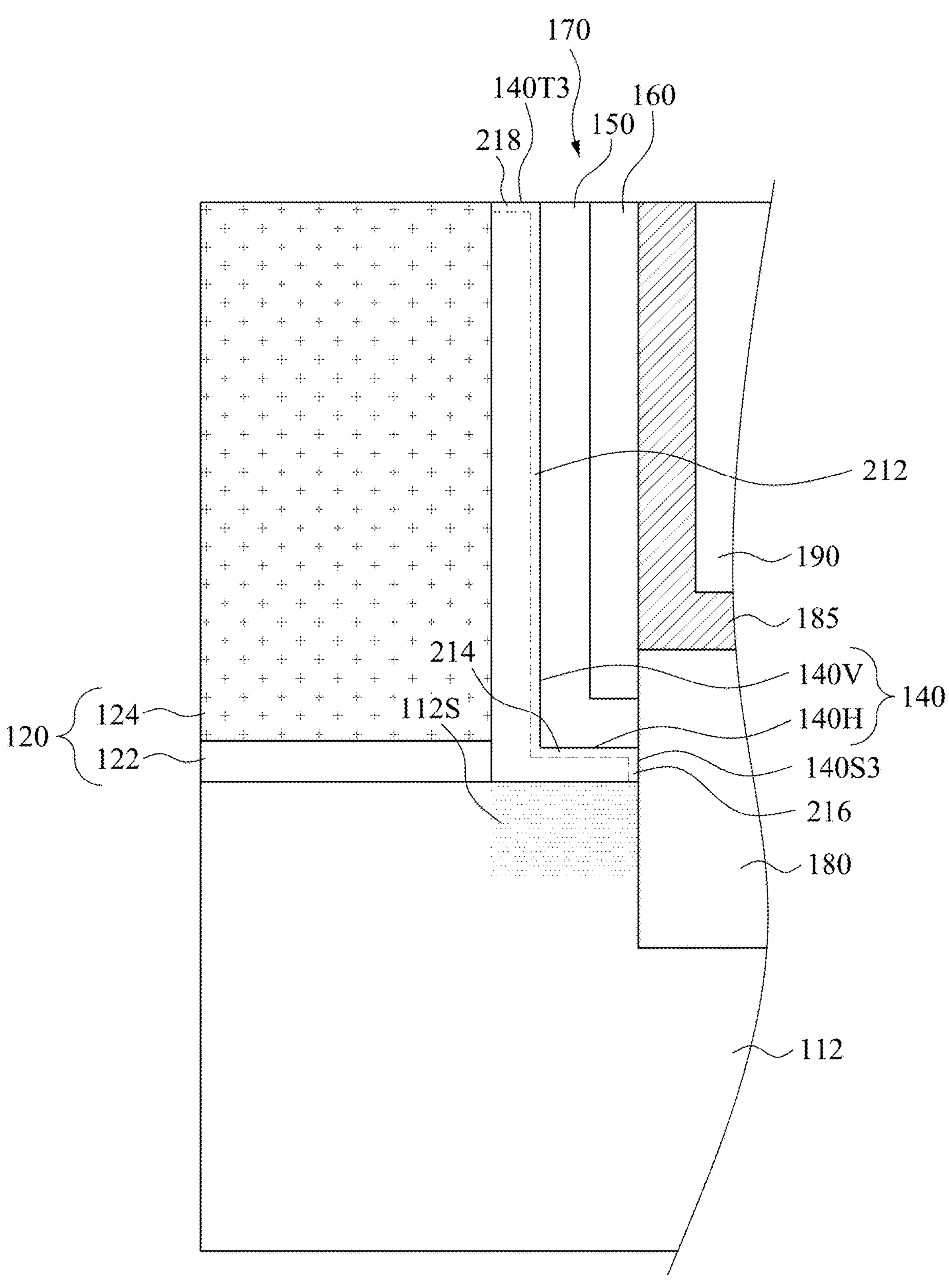

Reference is made to FIGS. 10A and 10B, in which FIG. 10B is an enlarged view of FIG. 10A. A CMP process is performed to remove excess materials of the CESL 185 and the ILD layer 190 until the top surfaces of the dummy gate structures 120 are exposed. Accordingly, the masks 130 (see FIG. 9) are removed as a result of the CMP process.

In FIG. 10B, after the CMP process, top surface 140T3 of the vertical portion 140V of the first spacer layer 140 may be exposed. In some embodiments, the gate spacers 170 may be exposed to the air after the CMP process. Accordingly, a region 218 of the vertical portion 140V of the first spacer layer 140 that is close to the top surface 140T3 of the vertical portion 140V of the first spacer layer 140 may be oxidized.

In some embodiments where the first spacer layer 140 is made of carbon doped silicon, the region 218 of the first spacer layer 140 made be oxidized to form a carbon doped silicon oxide layer. As mentioned above in FIGS. 4A and 4B, the first spacer layer 140 is a semiconductor layer, according, the region 218 of the first spacer layer 140 may be transferred from a semiconductor region to a dielectric region. Furthermore, the oxygen concentration (atomic percent) of the region 218 of the first spacer layer 140 may be higher than the regions of the first spacer layer 140 that are not oxidized. In some embodiments, because the first spacer layer 140 may be oxidized when exposed to the air, the first spacer layer 140 can act as an oxygen buffer layer to retard oxygen penetration.

Furthermore, the dielectric constant of the region 218 of the first spacer layer 140 may also be decreased to form low-k dielectric regions. That is, the region 218 of the first spacer layer 140 may include a dielectric constant lower than the dielectric constant of the regions of the first spacer layer 140 that are not oxidized.

Figure 11A:
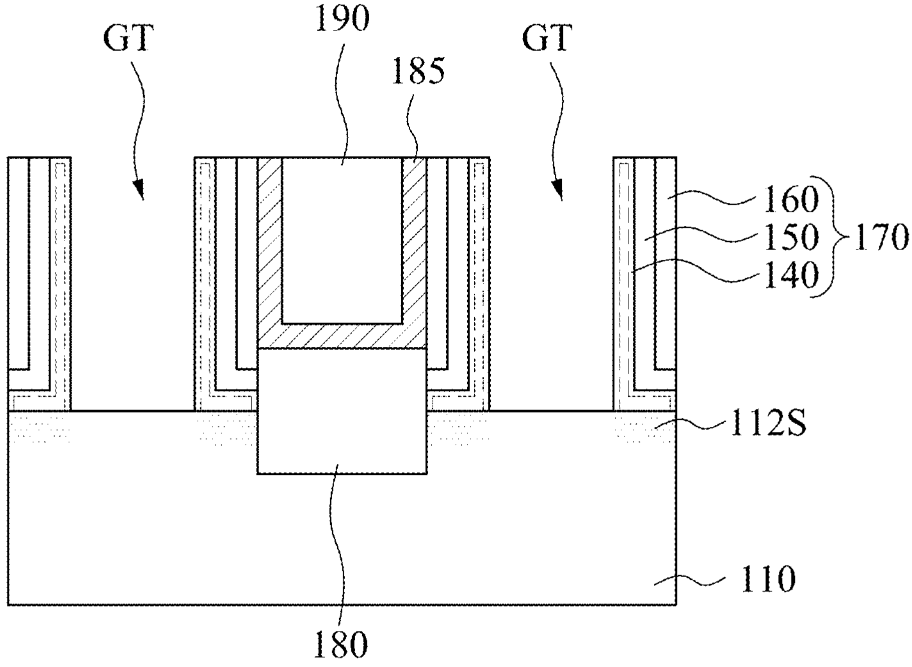
Figure 11B:
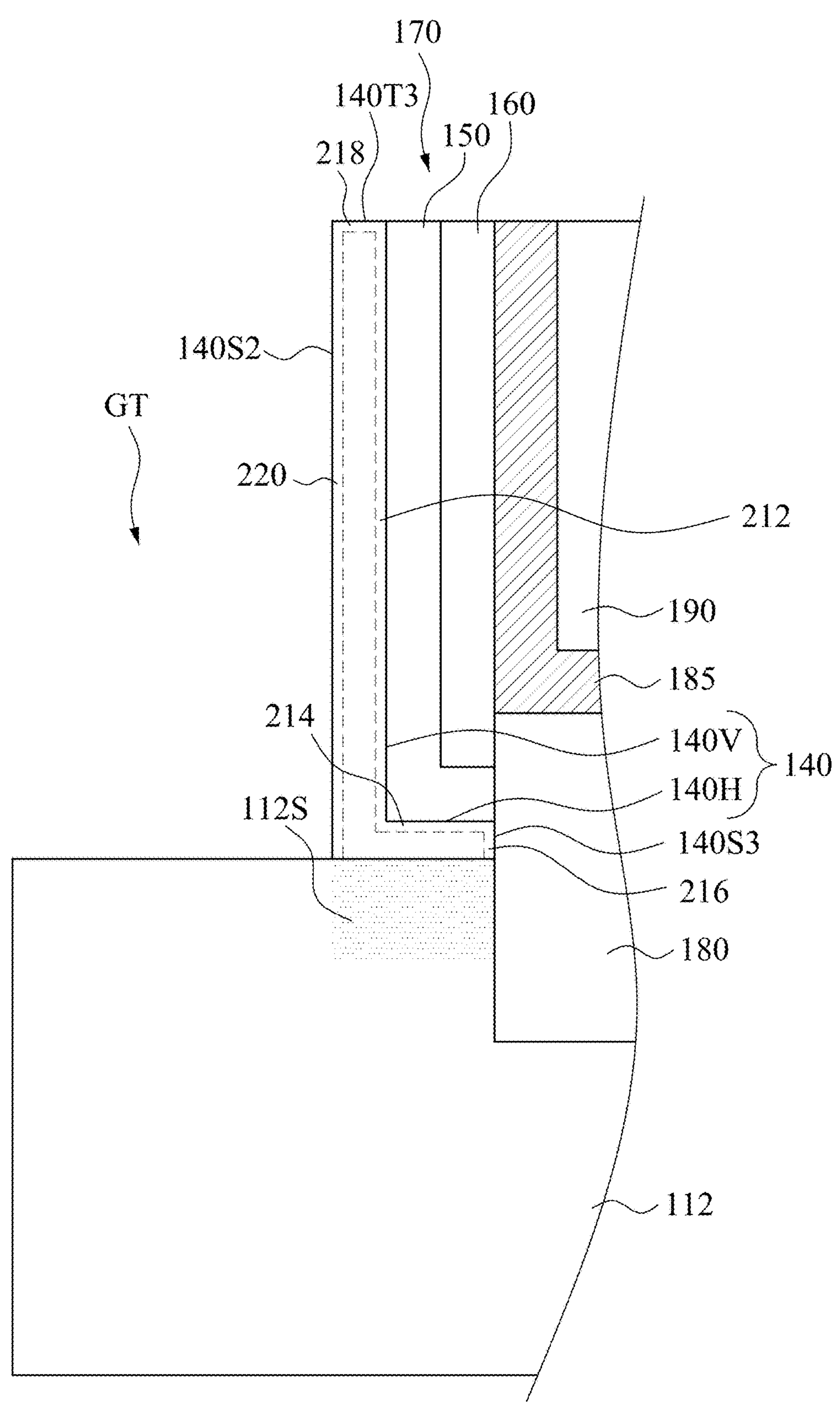

Reference is made to FIGS. 11A and 11B, in which FIG. 11B is an enlarged view of FIG. 11A. The dummy gate structures 120 are removed to form gate trenches GT between the gate spacers 170. In some embodiments, the dummy gate structures 120 may be removed by suitable etching process, such as dry etch, wet etch, or combinations thereof.

In FIG. 11B, after the dummy gate structures 120 are removed, inner sidewall 140S2 of the vertical portion 140V of the first spacer layer 140 may be exposed. In some embodiments, the gate spacers 170 may be exposed to the air after the dummy gate structures 120 are removed. Accordingly, a region 220 of the vertical portion 140V of the first spacer layer 140 that is close to the gate trench GT (or metal gate structure 200, see FIG. 12B) may be oxidized.

In some embodiments where the first spacer layer 140 is made of carbon doped silicon, the region 218 of the first spacer layer 140 made be oxidized to form a carbon doped silicon oxide layer. As mentioned above in FIGS. 4A and 4B, the first spacer layer 140 is a semiconductor layer, according, the region 218 of the first spacer layer 140 may be transferred from a semiconductor region to a dielectric region. Furthermore, the oxygen concentration (atomic percent) of the region 220 of the first spacer layer 140 may be higher than the regions of the first spacer layer 140 that are not oxidized. In some embodiments, because the first spacer layer 140 may be oxidized when exposed to the air, the first spacer layer 140 can act as an oxygen buffer layer to retard oxygen penetration, which will prevent the source/drain epitaxial structure 180 from being oxidized.

Furthermore, the dielectric constant of the region 220 of the first spacer layer 140 may also be decreased to form low-k dielectric regions. That is, the region 220 of the first spacer layer 140 may include a dielectric constant lower than the dielectric constant of the regions of the first spacer layer 140 that are not oxidized.

Figure 12A:
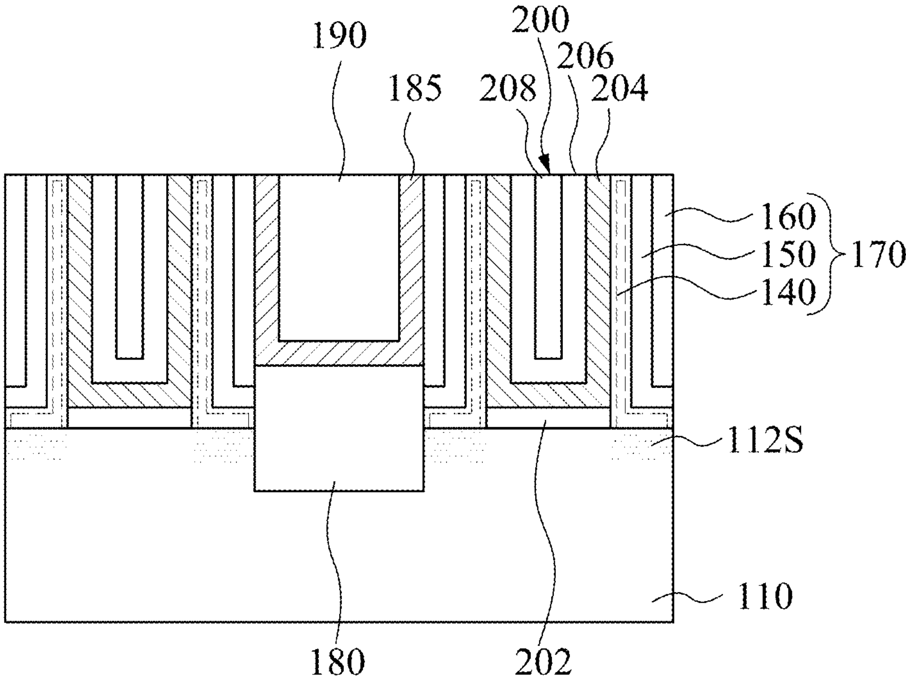
Figure 12B:
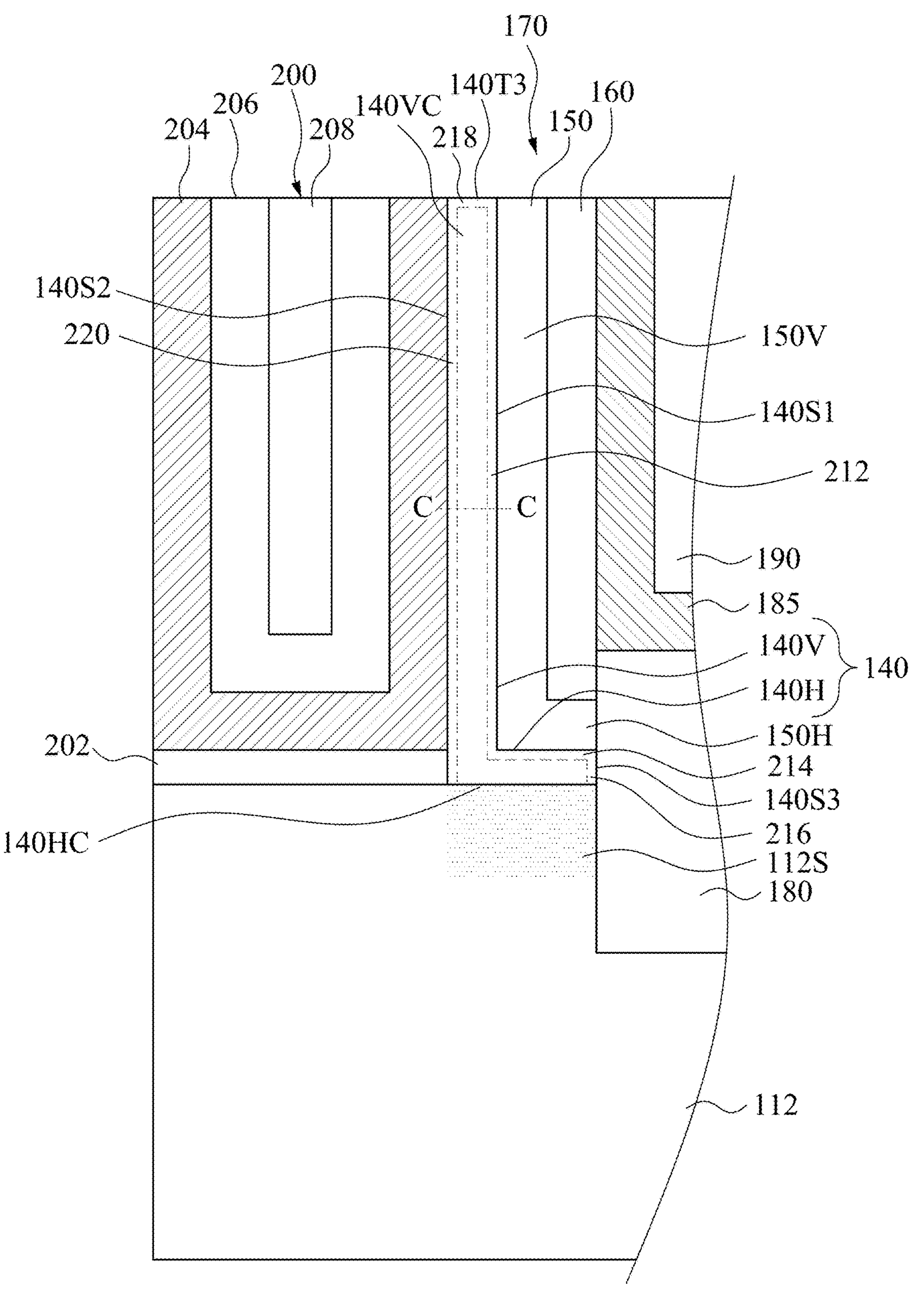

Reference is made to FIGS. 12A and 12B, in which FIG. 12B is an enlarged view of FIG. 12A. Metal gate structures 200 are formed in the gate trenches GT, respectively. In some embodiments, each of the metal gate structures 200 may include an interfacial layer 202, a gate dielectric layer 204, a work function metal layer 206, and a filling metal 208. In some embodiments, a CMP process may be formed after the metal gate structures 200 are formed to level the top surfaces of the metal gate structures 200, the gate spacers 170, and the ILD layer 190.

In some embodiments, interfacial layer 202 may be made of oxide, such as $SiO_2$. In some embodiments, the gate dielectric layers 204 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the work function metal layer 206 may include an n-type, a p-type work function layers, or combinations thereof to obtain a desired work function value. Exemplary p-type work function metals include TiN, TaN, Ru, Mo, Al, WN, $ZrSi_2$, MoSiz, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. In some embodiments, the filling metal 208 may include tungsten (W). In some other embodiments, the filling metal 208 includes aluminum (Al), copper (Cu) or other suitable conductive material.

In FIG. 12B, after the metal gate structures 200 are formed, each of the gate spacer 170 may include a first spacer layer 140, a second spacer layer 150 over the first spacer layer 140, and a third spacer layer 160 over the second spacer layer 150. The first spacer layer 140 includes a vertical portion 140V along the sidewall of the metal gate structures 200 and a horizontal portion 140H along the top surface of the semiconductor fin 112.

With respect to the vertical portion 140V of the first spacer layer 140, the vertical portion 140V may include a core region 140VC and surface regions 212, 218, 220, in which the surface region 218 is atop the core region 140VC and the surface regions 212, 220 are on opposite sides of the core region 140VC. In some embodiments, the core region 140VC can be regarded as the region that is not oxidized during the processes discussed in FIGS. 4A to 12B. Accordingly, the core region 140VC may include less oxygen concentration than the surface regions 212, 218, 220. The core region 140VC may include higher dielectric constant than the surface regions 212, 218, 220. In some embodiments, the surface regions 212, 218, 220 may include dielectric properties, while the core region 140VC may include semiconductor properties. The surface regions 212, 218 are in contact with the second spacer layer 150, and the surface region 220 is in contact with the interfacial layer 202 and the gate dielectric layer 204 of the metal gate structure 200. The surface region 220 and the core region 140VC both may be in contact with the semiconductor fin 112.

With respect to the horizontal portion 140H of the first spacer layer 140, the horizontal portion 140H may include a core region 140HC and surface regions 214, 216, in which the surface region 214 is atop the core region 140HC and the surface region 216 is aside the core region 140HC. In some embodiments, the core region 140HC can be regarded as the region that is not oxidized during the processes discussed in FIGS. 4A to 12B. Accordingly, the core region 140HC may include less oxygen concentration than the surface regions 214, 216. The core region 140HC may include higher dielectric constant than the surface regions 214, 216. For example, the core region 140HC may include dielectric constant in a range from about 6.5 to about 10, and the surface regions 214, 216 may include dielectric constant in a range from about 2.7 to about 3.2. In some embodiments, the surface regions 214, 216 may include dielectric properties, while the core region 140HC may include semiconductor properties. The surface regions 214 is in contact with the second spacer layer 150, and the surface region 216 is in contact with the source/drain epitaxial structure 180. The surface region 216 and the core region 140HC both may be in contact with the semiconductor fin 112.

Figure 12C:
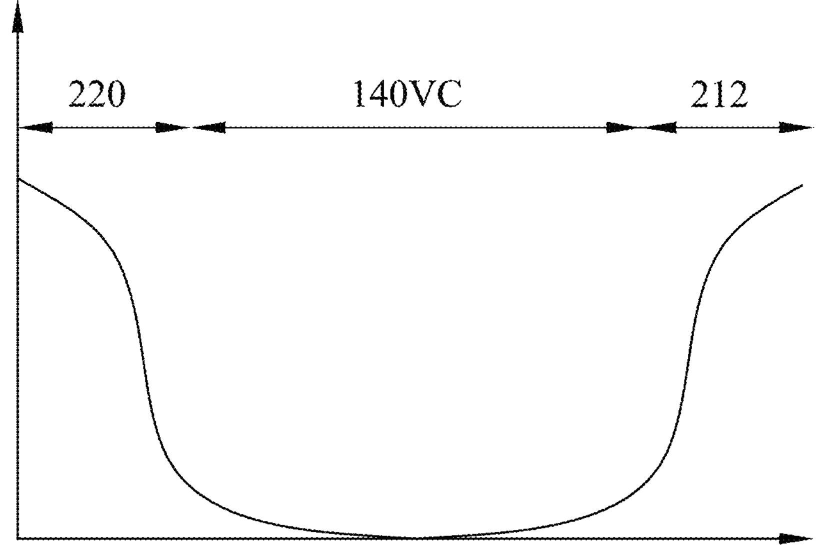

FIG. 12C illustrates an oxygen concentration profile along line C-C of FIG. 12B in which line C-C passes through the surface region 220 of the first spacer layer 140, the core region 140VC of the first spacer layer 140, and the surface region 212 of the first spacer layer 140. The oxygen concentration (atomic percentage) is shown on the vertical axis in FIG. 12C, and the distance is shown on the lateral axis in in FIG. 12C. As mentioned above, the core region 140VC is an unoxidized region in the first spacer layer 140. As a result, the oxygen concentration in the core region 140VC may be zero or negligibly small. On the other hand, the oxygen concentrations in the surface regions 220 and 212 may be non-zero, and may be greater than the oxygen concentration in the core region 140VC. In some embodiments, the oxygen concentrations in the surface regions 220 and 212 may decrease toward the core region 140VC.

As discussed above, it is understood that the first spacer layer 140 may include nonuniform oxygen concentration and nonuniform dielectric constant, while the second and third spacer layers may have more uniform oxygen concentration and more uniform dielectric constant than the first spacer layer 140.

Figure 13:
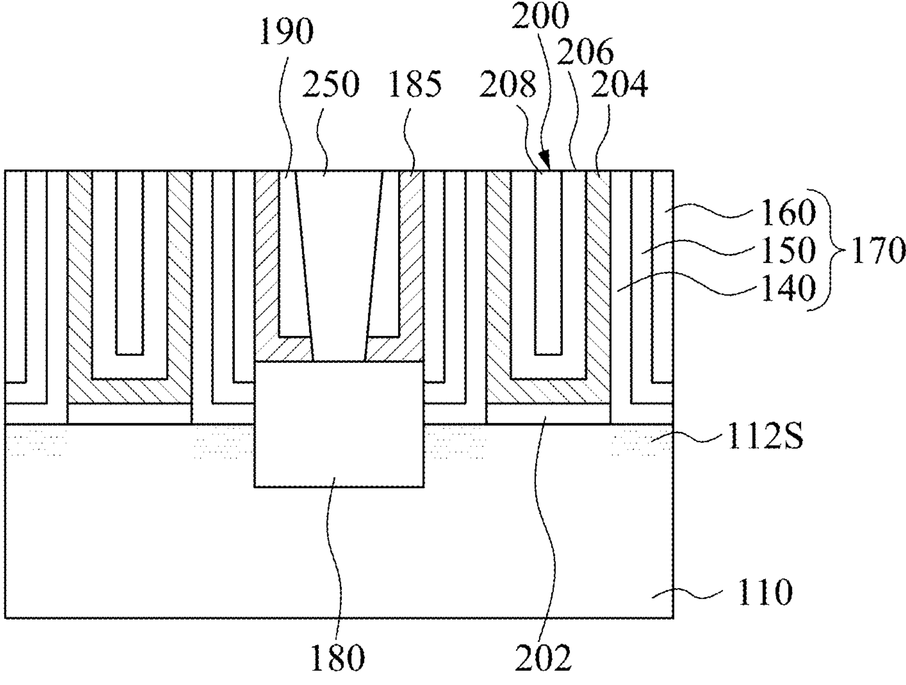

Reference is made to FIG. 13. A source/drain contact 250 is formed in the ILD layer 190 and is electrically connected to the source/drain epitaxial structure 180. In some embodiments, the source/drain contact 250 may include Ti, W, Co, Cu, Al, Mo, MoW, TiN, TaN, WN, combinations thereof, or other suitable conductive material. The source/drain contact 250 may be formed by, for example, patterning the ILD layer 190 to form opening that exposes the source/drain epitaxial structure 180, filling the opening with conductive material, and then performing a CMP process to remove excess conductive material until the metal gate structures 200 are exposed.

Figure 14:
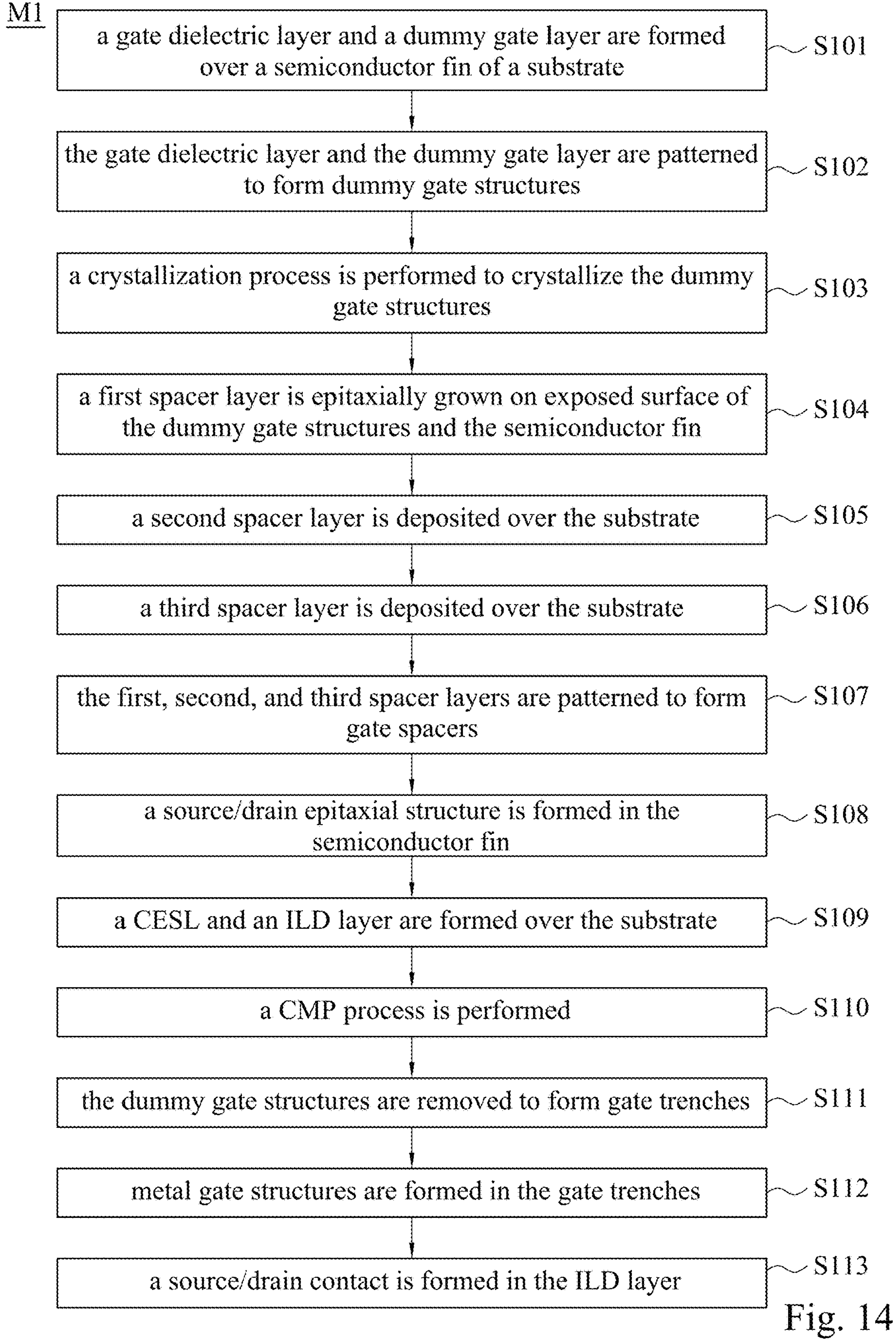
FIG. 14 illustrates a method of forming a semiconductor device in accordance with some embodiments of the present disclosure.

FIG. 14 illustrates a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At operation S101, a gate dielectric layer and a dummy gate layer are formed over a semiconductor fin of a substrate. FIG. 1 illustrates a cross-sectional view of some embodiments corresponding to act in operation S101.

At operation S102, the gate dielectric layer and the dummy gate layer are patterned to form dummy gate structures. FIG. 2 illustrates a cross-sectional view of some embodiments corresponding to act in operation S102.

At operation S103, a crystallization process is performed to crystallize the dummy gate structures. FIG. 3 illustrates a cross-sectional view of some embodiments corresponding to act in operation S103.

At operation S104, a first spacer layer is epitaxially grown on exposed surface of the dummy gate structures and the semiconductor fin. FIGS. 4A and 4B illustrate a cross-sectional view of some embodiments corresponding to act in operation S104.

At operation S105, a second spacer layer is deposited over the substrate. FIGS. 5A and 5B illustrate a cross-sectional view of some embodiments corresponding to act in operation S105.

At operation S106, a third spacer layer is deposited over the substrate. FIGS. 6A and 6B illustrate a cross-sectional view of some embodiments corresponding to act in operation S106.

At operation S107, the first, second, and third spacer layers are patterned to form gate spacers. FIGS. 7A and 7B illustrate a cross-sectional view of some embodiments corresponding to act in operation S107.

At operation S108, a source/drain epitaxial structure is formed in the semiconductor fin. FIGS. 8A and 8B illustrate cross-sectional views of some embodiments corresponding to act in operation S108.

At operation S109, a CESL and an ILD layer are formed over the substrate. FIG. 9 illustrates a cross-sectional view of some embodiments corresponding to act in operation S109.

At operation S110, a CMP process is performed. FIGS. 10A and 10B illustrate a cross-sectional view of some embodiments corresponding to act in operation S110.

At operation S111, the dummy gate structures are removed to form gate trenches. FIGS. 11A and 11B illustrate a cross-sectional view of some embodiments corresponding to act in operation S111.

At operation S112, metal gate structures are formed in the gate trenches. FIGS. 12A and 12B illustrate a cross-sectional view of some embodiments corresponding to act in operation S112.

At operation S113, a source/drain contact is formed in the ILD layer. FIG. 13 illustrates a cross-sectional view of some embodiments corresponding to act in operation S113.

In some embodiments, the operation S103 may be performed after the operation S104 and prior to the operation S105. That is, the crystallization process may be performed after the first spacer layer is formed.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a carbon doped silicon spacer layer is formed on opposite sidewalls of the dummy gate structure and surface of the semiconductor fin, the spacer layer may provide tensile stress to the channel, which will improve the carrier mobility, and will further improve device performance. Another advantage is that the carbon doped silicon spacer layer can act as an oxygen buffer layer to retard oxygen penetration, and may further source/drain region from being oxidized.

In some embodiments of the present disclosure, a method includes forming a gate dielectric layer and a dummy gate layer over a substrate; forming a mask over the dummy gate layer; patterning the gate dielectric layer and the dummy gate layer by using the mask as an etch mask to form a dummy gate structure, the dummy gate structure including a remaining portion of the gate dielectric layer and a remaining portion of the dummy gate layer; epitaxially growing a first spacer layer on the dummy gate structure and the substrate, in which the first spacer layer has a higher growth rate on the exposed surfaces of the dummy gate structure and the substrate than on exposed surfaces of the mask; doping the first spacer layer to form a doped spacer layer having a different lattice constant than the substrate; depositing a second spacer layer over the doped spacer layer; and etching the second spacer layer and the doped spacer layer to form a gate spacer on a sidewall of the dummy gate structure. In some embodiments, epitaxially growing the first spacer layer is performed such that the mask is free from coverage of the first spacer layer. In some embodiments, epitaxially growing the first spacer layer is performed such that a topmost end of the first spacer layer is lower than a topmost end of the mask. In some embodiments, the second spacer layer is in contact with sidewalls and a top surface of the mask. In some embodiments, the second spacer layer has a stepped sidewall. In some embodiments, the method further includes depositing a third spacer layer over the second spacer layer prior to etching the second spacer layer and the doped spacer layer. In some embodiments, the method further includes prior to epitaxially growing the first spacer layer, performing a crystallization process to convert amorphous silicon of the dummy gate layer of the dummy gate structure into polysilicon. In some embodiments, doping the first spacer layer including doping carbon into the first spacer layer.

In some embodiments of the present disclosure, a method includes forming a dummy gate structure over a substrate; performing an epitaxial growth process to form a first spacer layer on sidewalls of the dummy gate structure; doping the first spacer layer to form a doped spacer layer having a different lattice constant than the substrate; depositing a second spacer layer over the doped spacer layer; patterning the second spacer layer and the doped spacer layer to form gate spacers on the sidewalls of the dummy gate structure; removing the dummy gate structure to form a gate trench exposing an inner region of the doped spacer layer in the gate spacers, in which the inner region of the doped spacer layer in the gate spacers is oxidized; and forming a metal gate structure in the gate trench. In some embodiments, prior to depositing the second spacer layer, an outer region of the first spacer layer is oxidized. In some embodiments, doping the first spacer layer is in-situ performed with the epitaxial growth process of forming the first spacer layer. In some embodiments, doping the first spacer layer including doping carbon into the first spacer layer. In some embodiments, doping the first spacer layer is performed such that the doped spacer layer has a carbon atomic percentage in a range from about 1.6% to about 1.7%. In some embodiments, the method further includes performing a crystallization process to the dummy gate structure before performing the epitaxial grow. In some embodiments, the doped spacer layer induces a tensile stress to a channel region in the substrate.

In some embodiments of the present disclosure, a semiconductor device includes a substrate; a gate structure over the substrate; gate spacers on either side of the gate structure, the gate spacers each comprising: a first spacer layer comprising a first vertical portion vertically extending along a sidewall of the gate structure and a first horizontal portion laterally extending along the substrate; and a second spacer layer over the first spacer layer, the second spacer layer comprising a second vertical portion vertically extending along the first vertical portion of the first spacer layer and a second horizontal portion laterally extending along the first horizontal portion of the first spacer layer, wherein a first thickness difference between the first vertical portion and the first horizontal portion of the first spacer layer is greater than a second thickness difference between the second vertical portion and the second horizontal portion of the second spacer layer; and source/drain epitaxy structures on either side of the gate structure and separated from the gate structure by the gate spacers. In some embodiments, each of the gate spacers further includes a third spacer layer over the second spacer layer. In some embodiments, the first vertical portion of the first spacer layer is thicker than the first horizontal portion of the first spacer layer. In some embodiments, the second vertical portion of the second spacer layer has substantially a same thickness as the second horizontal portion of the second spacer layer. In some embodiments, the first spacer layer comprises carbon-doped silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a dummy gate structure over a substrate;

forming a silicon layer along a sidewall of the dummy gate structure;

doping the silicon layer with carbon to form a carbon-doped silicon layer;

forming a source/drain epitaxial layer adjacent to the dummy gate structure; and replacing the dummy gate structure with a metal gate structure, wherein after doping the silicon layer with carbon and prior to replacing the dummy gate structure with the metal gate structure, a first portion of the carbon-doped silicon layer is transferred to a carbon doped silicon oxide layer.

2. The method of claim 1, further comprising forming a spacer layer over the carbon-doped silicon layer.

3. The method of claim 2, further comprising etching the spacer layer and the carbon-doped silicon layer to form a gate spacer on the sidewall of the dummy gate structure.

4. The method of claim 1, wherein replacing the dummy gate structure with the metal gate structure comprises:

removing the dummy gate structure to form a gate trench, wherein a second portion of the carbon-doped silicon layer is transferred to a carbon doped silicon oxide layer through the gate trench; and forming a the metal gate structure in the gate trench.

5. The method of claim 1, wherein the silicon layer is selectively formed along the sidewall of the dummy gate structure, while a mask over the dummy gate structure is free from coverage by the silicon layer.

6. The method of claim 1, wherein forming the dummy gate structure comprises:

forming an amorphous silicon layer over the substrate; and performing a crystallization process to convert the amorphous silicon layer into a polysilicon layer, wherein the polysilicon layer serves as the dummy gate structure.

7. The method of claim 1, wherein doping the silicon layer is in-situ performed with forming the silicon layer.

8. A method, comprising:

forming a dummy gate structure over a substrate;

depositing a semiconductive layer along a sidewall of the dummy gate structure;

performing an implantation process to dope the semiconductive layer;

forming a source/drain epitaxial layer adjacent to the dummy gate structure; and removing the dummy gate structure to form a gate trench; and forming a metal gate structure in the gate trench, wherein after performing the implantation process and prior to forming the metal gate structure, a portion of the semiconductive layer is transferred to a dielectric layer.

9. The method of claim 8, wherein the portion of the semiconductive layer is transferred to the dielectric layer prior to forming the source/drain epitaxial layer.

10. The method of claim 9, wherein after the portion of the semiconductive layer is transferred to the dielectric layer, the method further comprises forming a spacer layer over the dielectric layer.

11. The method of claim 8, wherein the portion of the semiconductive layer is transferred to the dielectric layer prior to removing the dummy gate structure.

12. The method of claim 8, wherein the portion of the semiconductive layer is transferred to the dielectric layer after removing the dummy gate structure.

13. The method of claim 12, wherein the portion of the semiconductive layer is transferred to the dielectric layer through the gate trench.

14. The method of claim 8, wherein performing the implantation process to dope the semiconductive layer comprises using carbon to dope the semiconductive layer.

15. The method of claim 8, wherein the semiconductive layer is a silicon layer.

16. A semiconductor device, comprising:

a substrate;

a gate structure over the substrate;

gate spacers on either side of the gate structure, the gate spacers each comprising:

a first spacer layer, wherein along a horizontal direction, the first spacer layer has a core region and surface regions on opposite sides of the core region, and oxygen concentrations of the surface regions are greater than an oxygen concentration of the core region; and a second spacer layer over the first spacer layer; and source/drain epitaxy structures on either side of the gate structure and separated from the gate structure by the gate spacers.

17. The semiconductor device of claim 16, wherein the gate spacers each further comprises a third spacer layer over the second spacer layer.

18. The semiconductor device of claim 17, wherein the third spacer layer has a higher oxygen concentration than the second spacer layer.

19. The semiconductor device of claim 16, wherein the first spacer layer comprises carbon doped silicon oxide.

20. The semiconductor device of claim 16, wherein the second spacer layer has a more uniform oxygen concentration distribution than the first spacer layer.

* * * * *